(12) United States Patent
Vodrahalli et al.

(10) Patent No.: US 6,982,192 B1
(45) Date of Patent: Jan. 3, 2006

(54) HIGH PERFORMANCE THERMAL INTERFACE CURING PROCESS FOR ORGANIC FLIP CHIP PACKAGES

(75) Inventors: Nagesh Vodrahalli, Cupertino, CA (US); Biswajit Sur, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/475,104

(22) Filed: Dec. 30, 1999

(51) Int. Cl.
*H01C 21/44* (2006.01)
*H05B 6/64* (2006.01)
*H05B 6/70* (2006.01)
*H05B 6/50* (2006.01)
*H01L 23/495* (2006.01)
*H01L 23/10* (2006.01)

(52) U.S. Cl. .................. 438/122; 438/106; 438/112; 438/118; 219/678; 219/690; 219/759; 257/675; 257/706; 257/719; 257/796

(58) Field of Classification Search ............... 219/678, 219/690, 759; 438/106, 112, 122, 540, 118, 438/124, 126, 127; 257/675, 706, 719, 796, 257/723, 705, 666, 790, 707, 704, 738; 361/201, 361/702
See application file for complete search history.

(56) References Cited

U.S. PATENT DOCUMENTS

| | | | | |
|---|---|---|---|---|
| 4,681,996 A | * | 7/1987 | Collins et al. ............ 219/759 |
| 4,975,142 A | * | 12/1990 | Iannacone et al. .......... 216/18 |
| 5,072,283 A | * | 12/1991 | Bolger .................... 257/676 |
| 5,321,222 A | | 6/1994 | Bible et al. |
| 5,521,360 A | | 5/1996 | Johnson et al. |
| 5,523,260 A | * | 6/1996 | Missele .................. 156/330 |
| 5,721,286 A | * | 2/1998 | Lauf et al. |
| 5,734,201 A | * | 3/1998 | Djennas et al. ............ 257/783 |
| 5,789,270 A | * | 8/1998 | Jeng et al. ............... 438/106 |
| 5,844,217 A | * | 12/1998 | Hawley et al. ............ 219/762 |
| 5,909,056 A | * | 6/1999 | Mertol .................... 257/704 |
| 5,977,626 A | * | 11/1999 | Wang et al. ............... 257/707 |
| 5,981,312 A | * | 11/1999 | Farquhar et al. |
| 6,003,586 A | * | 12/1999 | Beane ..................... 164/63 |
| 6,014,999 A | * | 1/2000 | Browne ................... 156/512 |
| 6,069,023 A | * | 5/2000 | Bernier et al. ............ 438/107 |
| 6,104,090 A | * | 8/2000 | Unger et al. .............. 257/729 |
| 6,146,921 A | * | 11/2000 | Barrow |
| 6,191,360 B1 | * | 2/2001 | Tao et al. ................. 174/52.4 |
| 6,201,301 B1 | * | 3/2001 | Hoang .................... 257/712 |
| 6,208,519 B1 | * | 3/2001 | Jiang et al. ............... 361/717 |
| 6,226,187 B1 | * | 5/2001 | Questad et al. ............ 361/707 |
| 6,236,568 B1 | * | 5/2001 | Lai et al. ................. 361/704 |
| 6,261,404 B1 | * | 7/2001 | Baska et al. .............. 156/310 |
| 6,306,680 B1 | * | 10/2001 | Fillion et al. ............. 438/106 |
| 6,335,548 B1 | * | 1/2002 | Roberts et al. ............ 257/98 |
| 6,413,353 B2 | * | 7/2002 | Pompeo et al. .......... 156/307.3 |
| 6,457,506 B1 | * | 10/2002 | Lowry .................... 156/584 |
| 6,461,691 B1 | * | 10/2002 | Taylor et al. ............. 427/518 |
| 6,547,506 B1 | * | 4/2003 | Jacob ..................... 414/498 |

FOREIGN PATENT DOCUMENTS

JP        63-36091      *  2/1987

OTHER PUBLICATIONS

Jow, "Dielectric and Temperature Measurements During Microwaver Curing of Epoxy in a Sweeping Resonant Cqavity", 1987 IEEE, p. 465–468.*

* cited by examiner

*Primary Examiner*—Carl Whitehead, Jr.
*Assistant Examiner*—James Mitchell
(74) *Attorney, Agent, or Firm*—Blakely, Sokoloff, Taylor & Zafman LLP

(57) ABSTRACT

An integrated circuit package which has a thermal epoxy that can be attached to an integrated circuit and a thermal element. The thermal epoxy can be cured with energy at a microwave frequency. Curing the thermal epoxy with microwave energy can minimize package warpage during the curing process.

18 Claims, 1 Drawing Sheet

HIGH PERFORMANCE THERMAL INTERFACE CURING PROCESS FOR ORGANIC FLIP CHIP PACKAGES

BACKGROUND OF THE INVENTION

1. Field of the Invention

The present invention relates to a process for curing a thermal epoxy that couples an integrated circuit to a thermal element.

2. Background Information

Integrated circuits can be assembled into packages that are soldered to a printed circuit board. The integrated circuit is typically mounted to a substrate and enclosed by an encapsulant. Integrated circuits generate heat that must be removed from the package. Some integrated circuit packages incorporate thermal elements such as heat spreader to improve the thermal performance of the package. The heat spreader may be coupled to a surface of the integrated circuit by a thermal grease or a thermal epoxy.

The thermal epoxy may be cured in an oven that heats the entire package. The coefficient of thermal expansion of the substrate is typically different than the expansion coefficient of the integrated circuit and the thermal element. When the thermal epoxy is heated in the oven the different coefficient of expansions may create a warpage in the package. The warpage may induce a pumping action of the thermal epoxy so that epoxy flows out of the integrated circuit/thermal element interface. This pumping event may create an air gap between the integrated circuit and the thermal element. Air has a low coefficient of thermal conductivity. The existence of air increases the thermal impedance of the package and the junction temperatures of the integrated circuit. It would be desirable to provide a process that cures the thermal epoxy without heating the other elements of the package.

SUMMARY OF THE INVENTION

One embodiment of the present invention is an integrated circuit package which has a thermal epoxy that can be attached to an integrated circuit and a thermal element. The thermal epoxy can be cured with energy at a microwave frequency.

DETAILED DESCRIPTION

Figure 1:
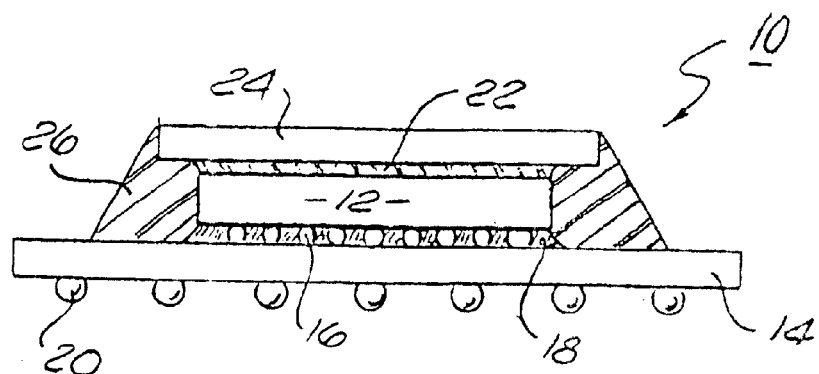
FIG. 1 is a cross-sectional view of an embodiment of an integrated circuit package of the present invention.

Referring to the drawings more particularly by reference numbers, FIG. 1 shows an embodiment of an integrated circuit package 10 of the present invention. The package 10 may include an integrated circuit 12 that is mounted to a substrate 14. The integrated circuit 12 may be mounted to the substrate 14 with a plurality of solder bumps 16 in a process commonly referred to as controlled collapsed chip connection (C4). The package 10 may further have an underfill material 18 attached to the integrated circuit 12 and the substrate 14 to improve the structural integrity of the solder bumps 16.

The package 10 may have a plurality of solder balls 20 attached to the substrate 14 in a ball grid array (BGA) pattern. The solder balls 20 may be reflowed to attach the package 10 to a printed circuit board (not shown) such as the motherboard of a computer. The substrate 14 may contain routing traces, power/ground planes, vias, etc. that electrically connect the solder bumps 16 to the solder balls 20. Although solder balls 20 are shown and described, it is to be understood that the package 10 may have other types of contacts such as pins.

The package 10 may have a thermal epoxy 22 that is attached to a thermal element 24 and the integrated circuit 12. The thermal element 24 may be a heat spreader that is constructed from a thermally conductive material such as copper or aluminum. The thermal epoxy 22 may be an epoxy resin that contains a thermally conductive filler such as carbon particles. The thermal epoxy 22 provides a thermal path from the integrated circuit 12 to the thermal element 24. The integrated circuit 12 may be enclosed by an encapsulant 26.

Figure 2A:
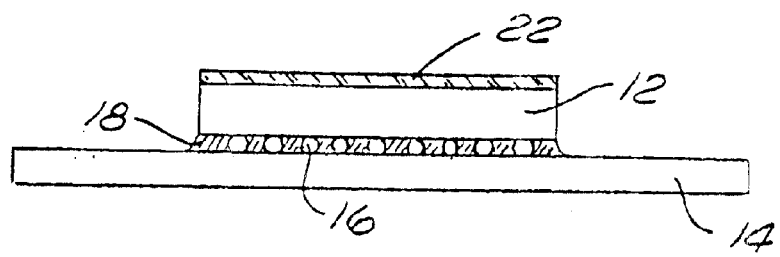
FIGS. 2a–b show a process for assembling a thermal epoxy within the integrated circuit package.
Figure 2B:
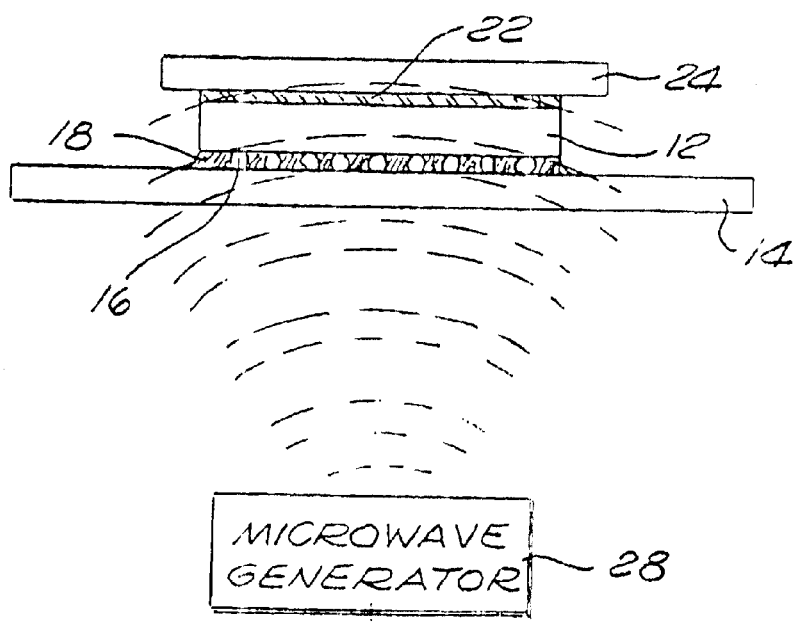

FIGS. 2a and 2b show a method for constructing the package 10. The integrated circuit 12 is typically mounted to the substrate 14 by the solder bumps 16 and underfill material 18. As shown in FIG. 2a an uncured thermal epoxy 22 is applied to the top surface of the integrated circuit 12. By way of example, the uncured epoxy 22 may be applied with a screening process that utilizes a template (not shown).

As shown in FIG. 2b the thermal element 24 is placed onto the thermal epoxy 22 and the epoxy 22 is cured by a microwave generator 28. The microwave generator 28 generates energy at a microwave frequency that is directed into the thermal epoxy 22. The microwave frequency can be selected to cure the thermal epoxy 22 without damaging the integrated circuit 12 or heating the other components of the package 10. Not heating the other package components eliminates package warpage and epoxy pumping that can create air gaps and voids in the integrated circuit/thermal element interface. By way of example, the microwave energy may have a frequency between 1000 and 300,000 megahertz. It is well known that the microwave range exist between 300,000 MHz and 1,000 MHz. After the thermal epoxy 22 is cured, the encapsulant 26 can be formed into the package with an injection mold process. The solder balls 20 can then be attached to the substrate 14 to complete the assembly. It may be desirable to bake the substrate 14 before curing the thermal epoxy 22 to insure that the curing process does not release water from the substrate material.

Although not shown, an alternate method for assembling the thermal epoxy 22 is contemplated. For this alternate method, the epoxy 22 is applied to the thermal element 24 instead of the integrated circuit 12 before being cured by the microwave generator 28.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for assembling an integrated circuit package, comprising:

applying a thermal epoxy after applying said epoxy to the integrated circuit to a top surface of an integrated circuit;

placing a thermal element adjacent to the thermal epoxy;

curing the thermal epoxy with energy at a microwave frequency without heating other components of the integrated circuit package, the curing of the thermal epoxy with the energy at the microwave frequency preventing (i) warpage of the integrated circuit package and (ii) epoxy pumping that would create air gaps between the thermal element and the integrated circuit; and applying an encapsulant over the integrated circuit, the thermal element and the thermal epoxy after curing of the thermal epoxy.

2. The method of claim 1, further comprising mounting the integrated circuit to a substrate.

3. The method of claim 2, further comprising attaching a solder ball to the substrate.

4. The method of claim 2, wherein the applying of the encapsulant comprises molding the encapsulant onto the substrate and the integrated circuit.

5. The method of claim 2, wherein prior to curing the thermal epoxy, the method further comprising baking a substrate onto which the integrated circuit is to be mounted.

6. The method of claim 1, wherein said thermal element is a heat spreader.

7. The method of claim 1, wherein said thermally conductive filler includes carbon particles.

8. The method of claim 1, wherein said placing or said thermal element includes attaching said thermal element to said epoxy.

9. The method of claim 1, wherein said curing of the epoxy includes selecting the microwave frequency to cure the thermal epoxy without damaging the integrated circuit or heating other components within the integrated circuit package; and generating energy at the microwave frequency by a microwave generator directed toward the thermal epoxy.

10. A method for assembling an integrated circuit package, comprising:

applying a thermal epoxy to a thermal element, the thermal epoxy being an epoxy resin contain a thermally conductive filler;

placing the thermal epoxy and the thermal element onto a top surface of an integrated circuit;

curing the thermal epoxy after applying said epoxy to the integrated circuit with energy at a microwave frequency without heating other components of the integrated circuit package, the curing of the thermal epoxy with the energy at the microwave frequency preventing (i) warpage of the integrated circuit package and (ii) epoxy pumping that would create air gaps between the thermal element and the integrated circuit; and applying an encapsulant over the integrated circuit, the thermal element and the thermal epoxy after curing of the thermal epoxy to form the integrated circuit package.

11. The method of claim 10, further comprising mounting the integrated circuit to a substrate.

12. The method of claim 11, further comprising attaching a solder ball to the substrate.

13. The method of claim 11, wherein the applying of the encapsulant comprises molding the encapsulant onto the substrate and the integrated circuit.

14. The method of claim 10, wherein prior to applying said thermal epoxy to the thermal element, the method further comprises providing a thermally conductive filler to a resin to form said epoxy.

15. The method of claim 10 further comprising baking a substrate into which the integrated circuit is to be mounted before curing the thermal epoxy.

16. The method of claim 10, wherein said curing of the thermal epoxy includes selecting the microwave frequency to cure the epoxy without damaging the integrated circuit or heating other components within the integrated circuit package; and generating energy at the microwave frequency by a microwave generator directed toward the thermal epoxy.

17. A method comprising:

applying a thermal epoxy to a thermal element;

mounting the thermal element on a top surface of an integrated circuit placed in an integrated circuit package mounted on a substrate, the thermal epoxy interposed between the thermal element and the integrated circuit;

baking the substrate along with the integrated circuit package, the thermal element and the thermal epoxy prior to curing the thermal epoxy;

curing the thermal epoxy after applying said epoxy to the integrated circuit by radiating energy at a microwave frequency toward the thermal epoxy cure the thermal epoxy without damaging the integrated circuit or heating other components of the integrated circuit package, the curing of the thermal epoxy by the radiating energy prevents (i) warpage of the integrated circuit package and (ii) epoxy pumping that would create air gaps between the thermal element and the integrated circuit.

18. The method of claim 17, wherein the epoxy is a thermal conductive filler with carbon particles.

* * * * *